(12) United States Patent
Tysoe et al.

(10) Patent No.: US 7,102,158 B2
(45) Date of Patent: Sep. 5, 2006

(54) LIGHT-BASED SYSTEM FOR DETECTING ANALYTES

(75) Inventors: Steven Alfred Tysoe, Ballston Spa, NY (US); Mark Philip D'evelyn, Niskayuna, NY (US); Frank John Mondello, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/746,292

(22) Filed: Dec. 29, 2003

(65) Prior Publication Data

US 2004/0195598 A1    Oct. 7, 2004

Related U.S. Application Data

(63) Continuation-in-part of application No. 09/694,690, filed on Oct. 23, 2000, now abandoned.

(51) Int. Cl.
H01L 23/58    (2006.01)
(52) U.S. Cl. .............................. 257/48; 257/79; 257/81; 257/82; 257/94; 257/99; 257/103
(58) Field of Classification Search ................. 257/41, 257/48, 79–103
See application file for complete search history.

(56) References Cited

U.S. PATENT DOCUMENTS 5,578,839 A    11/1996  Nakamura et al.
5,637,531 A    6/1997   Porowski et al.
5,770,887 A    6/1998   Tadatomo et al.
5,810,925 A    9/1998   Tadatomo et al.
6,015,979 A    1/2000   Sugiura et al.
6,281,526 B1 * 8/2001   Nitta et al. ................. 257/103
6,492,182 B1   12/2002  Bright et al.
6,680,206 B1 * 1/2004   McDevitt et al. ........... 436/172
6,700,179 B1 * 3/2004   Ouchi et al. ................ 257/627

OTHER PUBLICATIONS

Journal of Crystal Grown 189/190 (1998) 167-171 Blue Light-Emitting Diodes on GaN Substrates, Growth and Characterization, Pelzmann et al.
MRS nternet J. Nitride Semicond. Res. 4S1, G10.2 (1999) "GaN Homoepitaxy for Device Applications", Kamp et al.
ACTA Physics Polonica A, vol. 87 (1995) "High Pressure-Crystallization of III-V itrides", Porowski.

* cited by examiner

*Primary Examiner*—Wai-Sing Louie
(74) *Attorney, Agent, or Firm*—Shawn A. McClintic; William E. Powell, III

(57) ABSTRACT

Device, kit and method of using same to detect analytes such as nucleic acids are described. An excitation source, preferably a nitride-based LED, emits light capable of being absorbed by luminophores. Sensors are stably attached, preferably via covalent or ionic bonds, to a surface within the device, such as the surface of the excitation source that is exposed to the sample. When a complex is formed between the sensors and the analyte, the luminophores emit light or emit light of a different wavelength, thereby signaling the presence or quantity of the analyte.

29 Claims, 5 Drawing Sheets

US 7,102,158 B2

LIGHT-BASED SYSTEM FOR DETECTING ANALYTES

CROSS-REFERENCE TO RELATED APPLICATIONS

This application is a continuation-in-part of U.S. patent application Ser. No. 09/694,690, filed Oct. 23, 2000 now abandoned, which is herein incorporated by reference in its entirety.

BACKGROUND OF THE INVENTION

There is a need for analyte detection that combines the speed and sensitivity of light-based sensors with the high specificity of biomolecular assays such as nucleic acid hybridization assays. In applications ranging from metabolic diagnostics to detection of pathogenic organisms, biomolecules are typically detected through either nucleic acid amplification or antibody recognition. Signaling is usually accomplished by attaching luminescent labels to probes. These conventional tests are typically difficult to multiplex and require equipment that is bulky, intricate and expensive.

A number of systems combine the use of light-based sensors with the use of biomolecular probes. These systems usually involve complex optics to route light to a zone where the probes can interact with the analyte. The cost and complexity renders such systems impractical for routine diagnostics or biohazard monitoring.

Bright et al describe a microsensor array comprising a sensor located in microwells on the top surface of a light emitter, for example, an LED. See Bright et al, U.S. Pat. No. 6,492,182, filed Jul. 28, 2000, issued Dec. 10, 2002, and U.S. application Ser. No. 2003/0027353, filed Sep. 25, 2002, published Feb. 6, 2003. Bright et al disclose a sensor that is physically embedded in sol-gel glass inside the microwells. The sol-gel glass has a surface area of approximately 100 m$^2$/g and pores approximately 0.5–500 nm in diameter. The use of microwells complicates manufacture of the detection device. Moreover, the nano-pores in the glass impede or prevent in-diffusion when the analytes are biomolecules such as nucleic acids.

BRIEF DESCRIPTION OF THE INVENTION

An embodiment of the invention is a device for detecting the presence, quantity or action of an analyte. The device includes: (a) an excitation source that emits light capable of being absorbed and emitted by a luminophore; and (b) a sensor specific for the analyte that is attached via a covalent or ionic bond to a surface within the device that can be exposed to a sample.

An additional embodiment of the invention includes a kit for detecting the presence, quantity or action of an analyte in a sample. The kit includes: (a) the device described above; and (b) a luminophore, wherein the luminophore is capable of first emitting light or emitting altered light if the sensor interacts with the analyte.

Another embodiment of the invention includes a method for detecting the presence, quantity or action of an analyte in a sample. The method includes: providing the kit described above, and contacting the sensor with a sample potentially containing the analyte.

DETAILED DESCRIPTION OF THE INVENTION

Figure 1:
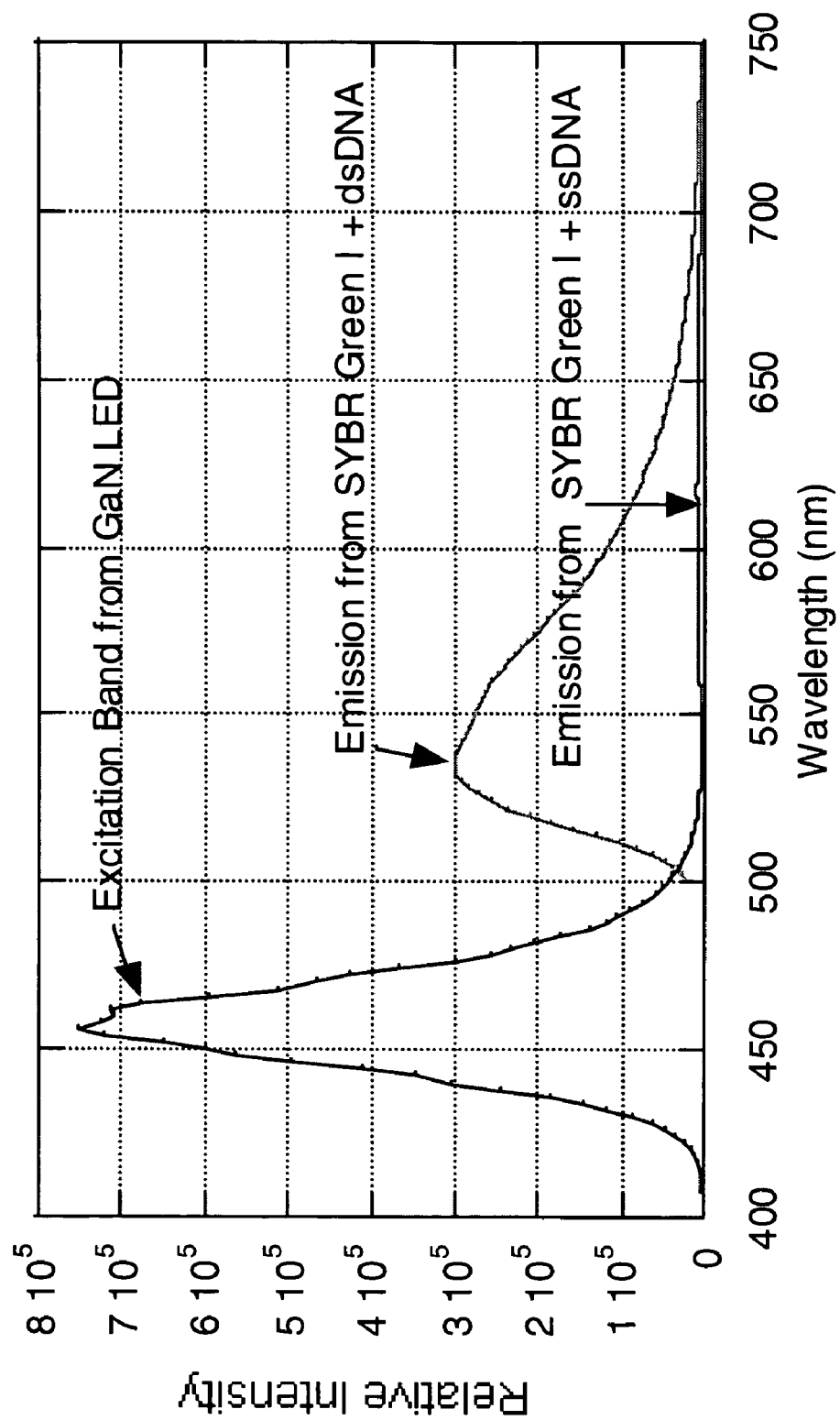
FIG. 1 shows the emission intensity of a commercially available GaN-based LED as a function of wavelength, with a peak emission wavelength of 460 nm.

Sensors preferably are attached to a surface of the inventive device that is exposed to the sample. In a preferred embodiment, the sensors are single stranded nucleic acids (ssDNA) specific for one or more analytes or produced by an organism of interest, and little or no signal is detected when only DNA or RNA from organisms other than the target are present. The sensors preferably are attached directly or indirectly to the surface via covalent or ionic bonds that remain substantially stable throughout the assay procedures. When the sensors are nucleic acids, the covalent or ionic bonds between the sensors and the surface preferably are stable from at about 0° C. to at least about 100° C. Most preferably, the surface to which the sensors are attached is a surface of the excitation source. The surface of the excitation source may be bare, in which case the sensors are covalently or ionically bound directly to the substrate material of the excitation source itself. Alternatively, the surface of the excitation source may include a coating (such as gold) or a matrix (such as sol-gel) that is bound to the excitation source, in which case the sensors are covalently or ionically bound to the coating or matrix.

The device preferably is employed in combination with luminophores that absorb light from the excitation source and that first emit light, or that emit light with a different characteristic, when the sensors interact with the analyte. For example, if a target nucleic acid is present in the sample, and if the target binds to the sensors on the LED to form DNA, RNA or RNA/DNA hybrids, then the luminophores will first emit light or will emit light that differs detectably from the light that they emit when the analyte is not bound to the sensors.

In a preferred embodiment, the luminophores (or complexes of luminophores and intercalator-type agents) are free in the sample solution. When the sensors and the analyte interact with each other to form sensor-analyte complexes, the luminophores associate with the sensor-analyte complexes. In another embodiment, the luminophores are initially bound to the sensors, or bound to the sensors at least prior to interaction between the sensors and the analyte, e.g., before duplex formation. In an alternative embodiment, the luminophores (or luminophore-intercalator complexes) are tethered to the same surface as the sensors. In this alternative embodiment, the luminophores typically are tethered to the surface via relatively flexible molecules (e.g., alkyl chains)

that are long enough to allow the luminophores to associate with the sensor-analyte complexes.

The ssDNA sensors are preferably bound to a surface of a GaN-based LED or another source of UV or visible light. Surface attachment of the ssDNA sensors is preferably achieved by sputter coating the surface with gold and by tethering the ssDNA sensors to the gold coating via thiolated 5' ends on the ssDNA. The LED with the tethered ssDNA sensors can be placed in a buffer solution containing ssDNA from a target organism and an appropriate luminescent dye bound to an intercalator agent. When the target ssDNA and the sensor ssDNA hybridize to form a duplex, the dye becomes associated with the duplex via intercalation or groove binding, which alters the conformation of the dye causing it to luminesce when excited by light emitted by the LED. The luminescence can be detected by an integral photodetector or the LED can be removed from the solution and the luminescence can be detected by eye, CCD detector, scanner, or with a fluorimeter or similar apparatus.

The excitation source, sensors, luminophores and other features of embodiments of the invention may be present as discrete elements or as an array of elements. Embodiments of the invention are suitable for simultaneously detecting or monitoring different analytes in a two-dimensional array. (As used herein, "array" includes microarray and nanoarray.)

Various embodiments of the invention include (A) a surface to which sensors may be bound, (B) an excitation source that emits light or electromagnetic radiation capable of being absorbed by luminophores, (C) sensors specific for the analyte and bound to the embodiments of the invention also may include (D) luminophores that are free in solution, bound to the sensors or tethered to the surface. Additionally, the invention may include (E) one or more optical filters and/or a photodetector. The invention can be used to (F) qualitatively or quantitatively detect or monitor various types of analytes, reactions and interactions. Features (A)–(F) are described below in detail.

A. Surface to which Sensors Bind

In preferred embodiments, the sensors are attached through covalent or ionic bonds to a surface within the device or kit that is exposed to the sample. The sensors may be attached directly to the surface or they may be attached to the surface via a coating, such as a sputtered coating of gold, that facilitates attachment of the sensors.

In another embodiment, the surface includes a channel(s) or trough(s) or the like, through which sample or analyte may flow and bind to sensors bound therein. In another embodiment, the surface is roughened to increase the surface area or the quantity of adsorbed sensor, thereby increasing sensitivity. However, in preferred embodiments the surface is non-porous, e.g., it includes no gel or porous matrix material. In more preferred embodiments, the surface has a low surface area, below 0.01 $m^2/g$, so as not to impede transport of molecules to the sensor. In another preferred embodiment, the surface is smooth and planar, i.e., it includes no microwells.

B. Excitation Source

In preferred embodiments, the sensors are attached through covalent or ionic bonds to a surface of the excitation source that faces the sample. The sensors may be attached directly to the excitation source itself or they may be attached to the excitation source via a coating, such as a sputtered coating of gold, that facilitates covalent or ionic attachment of the sensors. Such a coating should be sufficiently thin or otherwise transparent enough to substantially permit light emitted by the excitation source to pass therethrough. As used herein, "light" is not limited to visible or UV light and should be understood as being interchangeable with "electromagnetic radiation," except where specifically indicated otherwise.

In another preferred embodiment, the sensors are isolated from each other by laying down a grid over the surface to which the sensors are attached. Preferably, the grid is composed of an opaque and inert material (such as a metal, alumina, aluminum garnet or sapphire) and the grid is laid down over the excitation source, which emits light between the grid lines.

In another preferred embodiment, the excitation source has a "flip-chip" configuration. In a flip-chip configuration, the epitaxial (cladding) layers are separated from the sample solution by the substrate on which they are grown. In other words, the epitaxial layers are on the bottom of the substrate rather than on the top of the substrate. As such, in a flip-chip embodiment of the present invention in which the sensors are bound to the surface of the excitation source, the substrate portion of the excitation source is interposed between the sample solution and the epitaxial layers of the excitation source. The separation of the electrical contacts of the epitaxial layers from the sample solution prevents short circuits. It also allows heat to dissipate from the epitaxial layers away from the immediate proximity of the bound sensors, thereby preventing such heat from altering the hybridization conditions.

Figure 2:
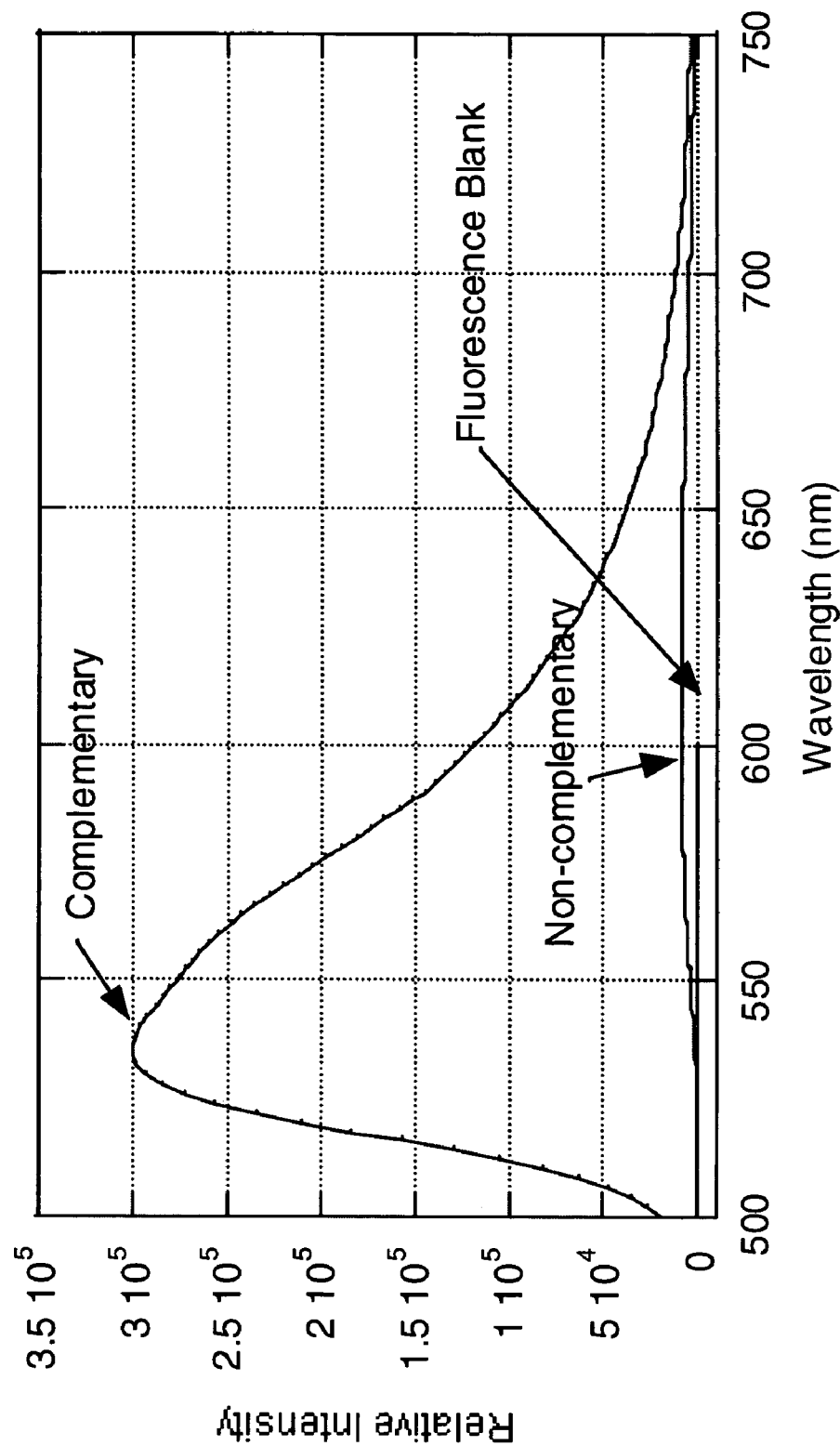
FIG. 2 shows a fluorescence signal generated by hybridization of complementary ssDNA molecules in the presence of SYBR Green I. A non-complementary ssDNA molecule and a fluorescence blank is shown for comparison purposes.

In another preferred embodiment, the excitation source emits monochromatic light or light for which the full width at half maximum (FWHM) of the emission spectrum is less than about 10% of the peak wavelength. Methods of making nitride-based LEDs that are essentially monochromatic and free of luminescence at lower wavelengths are known in the art. FIG. 1 shows the emission intensity of a commercially available GaN-based LED as a function of wavelength, with peak emission wavelength of 460 nm. The FWHM is <10%, and the emission intensity at 460 nm is a suitable wavelength to allow for absorption and subsequent luminescence from the luminophore at wavelengths longer than 480 nm. FIG. 2 shows a fluorescence signal generated by hybridization of complementary ssDNA molecules in the presence of SYBR Green I. A non-complementary ssDNA molecule and a fluorescence blank is shown for comparison purposes.

If the light emitted by the excitation source has significant intensity at the same wavelength as the light emitted by the luminophores when the sensors interact with the analyte, the light emitted by the excitation source constitutes a background signal that reduces sensitivity. This background signal from the excitation source may be mitigated or eliminated in several ways. For example, using a GaN-based vertical cavity surface emitting laser (VCSEL) or a resonanant cavity LED (RCLED) will both narrow the spectrum of excitation light and reduce off-resonance light emission. In a further embodiment, the LED incorporates a resonant cavity design in order to further increase the ratios of the intensities at the excitation and detection wavelengths, as described by Song et. al. [Appl. Phys. Lett. 77, 1744 (2000)].

In more preferred embodiments, the excitation source is a homoepitaxial GaN-based light emitting diode (LED) or resonant cavity device having minimal threading dislocations in the substrate, which greatly reduces emission of yellow light. Such homoepitaxial GaN-based LEDs and resonant cavity devices are described below in detail and are also disclosed in U.S. patent application Ser. No. 09/694,690, and in D'Evelyn et al's U.S. patent application entitled "Group III-Nitride based resonant cavity light emitting devices fabricated on single crystal gallium nitride substrates," filed Oct. 27, 2003, both of which are incorporated by reference herein in their entireties.

In most preferred embodiments, the homoepitaxial LED comprises a light emitting semiconductor active region disposed on a substrate comprised of GaN having a dislocation density less than $10^5$ per $cm^2$, more preferably below $10^3$ per $cm^2$. The homoepitaxial light emitting diode is comprised of a n-electrode, a n-GaN substrate, a n-GaN or n-$Al_wGa_{1-w}N$ cladding layer, an $In_xGa_{(1-x)}N$ active layer, a p-$Al_yGa_{(1-y)}N$ cladding layer, a p-GaN cladding layer, and a p-electrode, wherein $0 \leq w,x,y \leq 1$.

In an additional embodiment, a resonant cavity light emitting device is comprised of a stack of group II nitride layers, including an active region. A single crystal gallium nitride substrate on which the stack of group III nitride layers is disposed is substantially free of tilt boundaries. The single crystal gallium nitride substrate has a dislocation density less than $10^4$ $cm^{-2}$. First and second mirrors define a resonant cavity inside of which the active region is disposed. Light produced by the active region resonates in the resonant cavity.

Preferably, the GaN substrate consists of an (0001)-oriented GaN wafer cut from a boule that was grown using a supercritical solvent at a temperature greater than about 550° C. and a pressure greater than about 5 kbar.

One suitable process for forming the GaN substrate comprises providing a source gallium nitride, solvent, and mineralizer. The source gallium nitride may comprise at least one of poorly-crystallized gallium nitride, well-crystallized gallium nitride, amorphous gallium nitride, polycrystalline gallium nitride, and combinations thereof. The source gallium nitride may be provided "as-is" in its raw form. Alternatively, the source gallium nitride can be compacted into a "pill" and/or sintered into a polycrystalline compact. Alternatively, the source gallium nitride can be formed in situ. Gallium metal may be provided, which then reacts with the ammonia solvent after sealing of the capsule and treatment at high pressure and high temperature to form source gallium nitride.

The source gallium nitride may then be combined with at least one of the mineralizer and solvent to form a mixture. The gallium nitride, solvent, and mineralizer may optionally be provided individually to the capsule as separate and distinct un-combined materials. The mixture, which can comprise gallium nitride and at least one of the solvent and mineralizer, can be optionally compacted into a pill, however the compacting of the mixture need not be conducted in the gallium nitride growth process.

The source gallium nitride, solvent, and mineralizer, whether as a mixture that is compacted or not compacted, are then placed inside a capsule. Optionally, additional mineralizer can also be added to the capsule. The capsule, which will be described hereinafter, can then be filled with a nitrogen-containing solvent, for example at least one of ammonia or hydrazine, or an organic solvent, including but not limited to, methylamine, melamine, or ethylene diamine, and mixtures thereof. The capsule is then sealed, disposed in a pressure cell, and subjected to high pressure and high temperature conditions in an appropriate high pressure high temperature (HPHT) system. The HPHT conditions are maintained for a length of time sufficient to dissolve the source gallium nitride and re-precipitate it onto at least one gallium nitride crystal, gallium nitride boule, or gallium nitride crystal seed.

Maintaining HPHT conditions yields large single gallium nitride crystals, for example single gallium nitride crystals having a diameter and thickness in a range from about 0.02 inch (about 0.05 cm) to about 12 inches (about 30 cm), for example a size in a range from about 2 inches to about 6 inches. The pressure, as embodied by the invention, is in a range from greater than about 5 kbar to about 80 kbar, and the temperature for the gallium nitride crystal growth process is in a range between about 550° C. and about 3000° C. The GaN single crystals thus formed are substantially transparent, with an absorption coefficient below 100 $cm^{-1}$. Furthermore, the substrates of the present invention have carrier mobilities above about 100 $cm^2$ V-s and strain, with respect to undoped GaN homoepitaxial layers, below about 0.005%.

The HPHT system is then allowed to cool and the high pressure is relieved. The gallium nitride crystals are removed from the HPHT system and pressure cell and washed in water and mineral acids. The mineral acids for washing the gallium nitride crystals include, but are not limited to, hydrochloric acid (HCl) and nitric acid ($HNO_3$).

The mineralizers preferably comprise at least one of alkali and alkaline-earth nitrides, such as at least one of $Li_3N$, $Mg_3N_2$, and $Ca_3Na_2$; amides, such as $LiNH_2$, $NaNH_2$, and $KNH_2$; urea and related compounds, ammonium salts, such as $NH_4F$ and $NH_4Cl$; halide, sulfide, and nitrate salts, such as NaCl, $CeCl_3$, $Li_2S$, and $KNO_3$; lithium salts, and combinations thereof. The mineralizers may be provided as solids or as additives dissolved in fluids, such as solvents. The use of alkaline-earth or rare-earth mineralizers have the additional advantage of acting as a getter for adventitious oxygen in the growth medium, allowing for the growth of undoped GaN crystals with low n-type carrier density. Alternatively, the mineralizer can be formed in situ. At least one of lithium, sodium, potassium, rubidium, cesium, magnesium, calcium, strontium, barium, or a rare-earth metal may be provided, which then react with the ammonia solvent to form the mineralizer.

The filling and sealing steps for making a preferred GaN substrate will now be described. The capsule is filled with a nitrogen-containing solvent, for example at least one of ammonia or hydrazine or an organic solvent, including, but not limited to methylamine, melamine, or ethylenediamine, without admitting air or water, which are undesirable in the gallium nitride formation process. To fill the capsule without admitting air or water, the capsule is filled and connected to a negative pressure source, such as a vacuum manifold, and evacuated. The capsule is then chilled to a temperature below room temperature (preferably about −72° C. or below) and vapor-phase solvent can be admitted to the manifold. The vapor-phase solvent then condenses in the capsule. For example, if the nitrogen-containing solvent comprises ammonia, the condensation can be performed at dry ice or liquid-nitrogen temperatures.

The capsule can then be isolated so as to seal the capsule by closing a valve to the negative pressure source. The capsule can then be separated from at least one of the manifold or the valve by a pinching-off step using a cold welding apparatus, which is well known in the art. The pinching-off step is particularly effective if the capsule is copper. The integrity of the seal may be enhanced by optional arc welding.

The capsule and pressure cell comprise any appropriate form that permit the gallium nitride growth process to withstand the high pressure and high temperature as embodied by the invention. The HPHT system that applies the high pressures and high temperatures can comprise a press device, which may include at least one of a die and punch. For example, the press device comprises one of a piston-cylinder press; a belt press; a tetrahedral-, cubic-, or octahedral-anvil press; a recessed-anvil press; and a toriod-type press, each of which are known to those of skill in the art.

The GaN crystal formed is of high quality as determined by a measurement of dislocation density. The dislocation density is determined by performing transmission electron microscopy (TEM) on a thin section, as is well known in the art. Preferably, the GaN crystal contains less than $10^5$ threading dislocations per cm$^2$, preferably less than $10^3$ dislocations per cm$^2$.

After the crystal has been formed, the substrate is cut from a boule formed by the method described above. The wafer comprises n-type GaN, with an electrical resistivity less than about 1000 Ω-cm, more preferably less than about 100 Ω-cm, or even more preferably less than about 10 Ω-cm. The substrate is then polished to a mirror finish using mechanical-polishing techniques. These techniques are well known in the art. Subsurface damage may remain after the polishing process. This damage may be removed by several methods that are known in the art, including chemically assisted ion beam etching or chemo-mechanical polishing. The residual damage may also be removed by heating the wafer to a temperature between about 900 and 1500° C. in an atmosphere containing ammonia at a partial pressure between about $10^{-8}$ mbar and 20,000 bar. The substrate preferably has a thickness between about 0.01 and 10 mm, most preferably between about 0.05 and 5 mm.

The wafer is preferably a wurtzite-structure material. Moreover, the (0001)-oriented GaN wafers will have a Ga-terminated (0001) face and an N-terminated (000$\bar{1}$) face. It is expected that the (0001) Ga face will be superior for deposition of LED and LD structures.

To begin fabrication of the LED, the GaN wafer is placed in a growth reactor which is then evacuated. Residual surface defects are annealed, and/or adventitious contaminants removed, by heating the wafer to a temperature between about 900 and 1200° C. in an atmosphere containing ammonia at a partial pressure between about $10^{-6}$ mbar and about 1 bar. The active LED structure is fabricated by metalorganic vapor-phase epitaxy (MOVPE) or by molecular beam epitaxy (MBE). These techniques are well known in the art.

Figure 3:
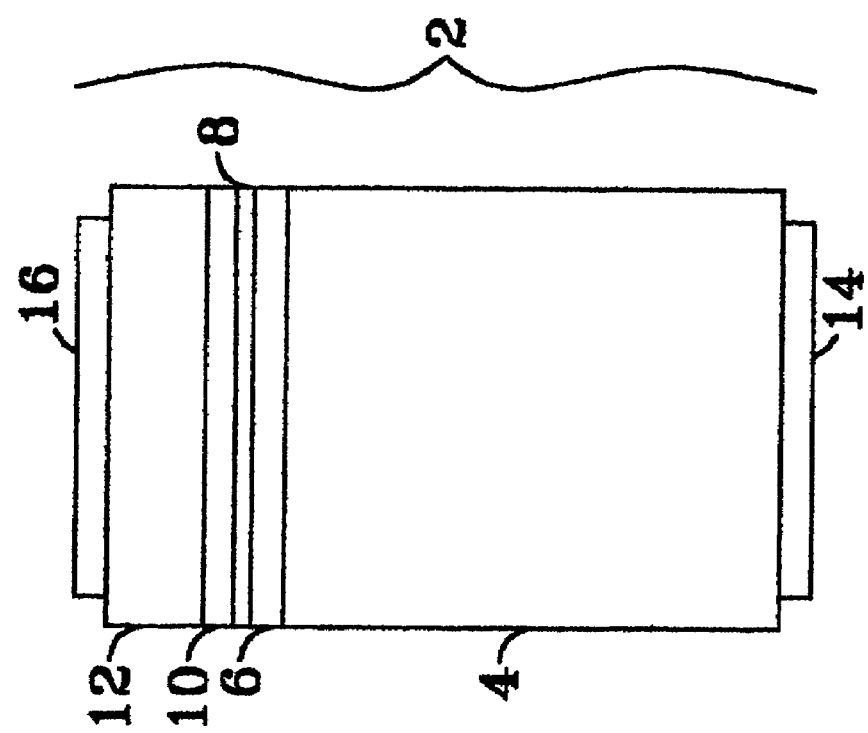
FIG. 3 illustrates the structure of a preferred excitation source, a homoepitaxial light emitting diode (LED).

FIG. 3 illustrates the structure 2 of a preferred homoepitaxial LED. The GaN wafer 4 is shown as the substrate upon which the LED is formed. The structure 2 is formed by decomposition of organometallic precursors in an ammonia-containing atmosphere on the substrate 4 surface. A carrier gas, such as hydrogen or helium, may be used. Suitable organometallic precursors include trimethylgallium, trimethylaluminum, trimethylindium, and mixtures thereof. Suitable dopant precursors include silane for n-type material, and bis-(cyclopentadienyl) magnesium or dimethyl zinc, for p-type material.

After the substrate 4 has been annealed, as described above, a cladding layer of n-type GaN or $Al_wGa_{1-w}N$, where $0 \leq w \leq 1$, 6 is optionally formed on the surface of the substrate 4. The n-type GaN or $Al_wGa_{(1-w)}N$ cladding layer 6 has a thickness between about 1 nm and 10 μm, preferably between about 0.1 and 4 μm. The deposition of the n-type GaN or $Al_wGa_{1-w}N$ cladding layer 6 may lead to improved electrical properties relative to the substrate itself, a different doping level and electrical conductivity, a higher bandgap, or combinations thereof.

An active layer 8 preferably is then deposited on the optional n-type GaN or $Al_wGa_{(1-w)}N$ 6 or the substrate 4, in the absence of the n-type GaN or $Al_wGa_{(1-w)}N$ 6 layer. The active layer 8 preferably comprises $In_xGa_{(1-x)}N$, where $0 \leq x \leq 1$. As x varies from 0 to 1, the bandgap varies between 3.4 and 2.0 eV, allowing for light emission between the ultraviolet and amber regions of the electromagnetic spectrum. Typically, x will lie between about 0.025 and 0.6, more particularly between about 0.05 and 0.5. The active layer may be undoped, n-type doped with impurities such as Si or Ge, or p-type doped, with impurities such as Zn or Mg. It may comprise a single layer, as in so-called double heterostructure or single quantum-well structures, or it may consist of a superlattice of $In_xGa_{(1-x)}N$ and $In_yGa_{(1-y)}N$, where $0 \leq y \leq x$, in so-called multiple-quantum well structures. The superlattice will preferably consist of about 1–50 alternating layers of the two different compositions of InGaN, with the more In-rich layers (lower bandgap) comprising the well and the less In-rich layers (higher bandgap) comprising the barrier. Each individual layer may have a thickness between about 0.5 and 50 nm. The well and barrier layers may be undoped, n-type, or p-type doped. The preferred structure comprises undoped well layers, and n-type doped or undoped barrier layers. InN and $In_xGa_{(1-x)}N$ decompose at a temperature lower than does GaN. Therefore, these layers should be deposited at temperatures between about 500 and 1200° C., more preferably between about 650 and 1050° C.

If the active layer is n-type doped, and relatively thick, between about 50 and 500 nm, the LED would have a double-heterostructure, particularly if the n-type cladding layer 6 comprised $Al_wGa_{(1-w)}N$ rather than GaN. If the active layer is undoped and relatively thin, about 1 to 10 nm, the LED would be a single quantum well, particularly if an additional n-$Al_wGa_{(1-w)}N$ cladding layer and a n-$In_yGa_{(1-y)}N$ barrier layer, with y<x, were positioned between the n-GaN layer 6 and the active layer 8.

One or more cladding layers are optionally disposed around the active layer 8. As shown in FIG. 3, these cladding layers 10, 12 comprise p-type cladding layers. Cladding layer 10 preferably comprises $Al_zGa_{(1-z)}N$, wherein $0 \leq z \leq 1$, and cladding layer 12 preferably comprises p-GaN. The cladding layers 10, 12 have the property of a larger bandgap than that of the active layer 8, and are useful for confining the electrical carriers and, in the case of laser diodes, of favorably directing light emission in the desired directions. The cladding layers 6, 10, and 12 preferably are deposited at temperatures between about 600 and 1500° C., more preferably between about 850 and 1200° C.

One common impurity in GaAlInN LEDs is hydrogen. In the case of p-type material, the hydrogen may complex with acceptor centers and cause the resistivity to be high, degrading performance. The hydrogen-acceptor complexes may be dissociated in the present invention by annealing at a temperature above about 400° C., or their formation may be avoided in the first place by use of a hydrogen-free growth environment, such as argon, nitrogen, or vacuum. In the absence of hydrogen, the resistivity of the p-type layers should be below about $10^5$ Ω-cm.

In the final step in the formation of the preferred light emitting diodes, metallic contacts 14,16 preferably are formed on the top (p-type) and bottom (n-type) surfaces. Most of the area of the p-type contact 16 is very thin, about 0.001 to about 1 μm thick, so as to be substantially optically transparent. Suitable compositions for the p-type contact 16 include nickel-gold, or at least one metal chosen from Pd, Pt, Au, Al, Sn, In, Cr, Ti, and mixtures thereof. The nickel-gold p-type contact 16 may be alloyed or may contain a nickel-rich composition in contact with the p-GaN layer 12, and a gold-rich composition in contact with the nickel-rich layer.

One suitable composition for the n-type contact 14 is titanium-aluminum. The titanium-aluminum n-type contact 14 may be alloyed or may contain a titanium-rich composition in contact with the n-GaN substrate 4 and an aluminum-rich composition in contact with the titanium-rich layer. Alternatively, the n-type contact 14 may be formed using at least one of Al, Sc, Ti, Zr, Ta, W, Ni, Cu, Ag, Au, Pd, Hf, a rare earth metal, and mixtures thereof. The contacts 14,16 may be deposited by any means known in the art. Preferred methods for the deposition of the metal contacts 14, 16 include sputter-deposition or e-beam evaporation. The metal contacts 14, 16 will perform best as ohmic contacts if annealed to a temperature between about 400 and 1200° C.

Figure 4:
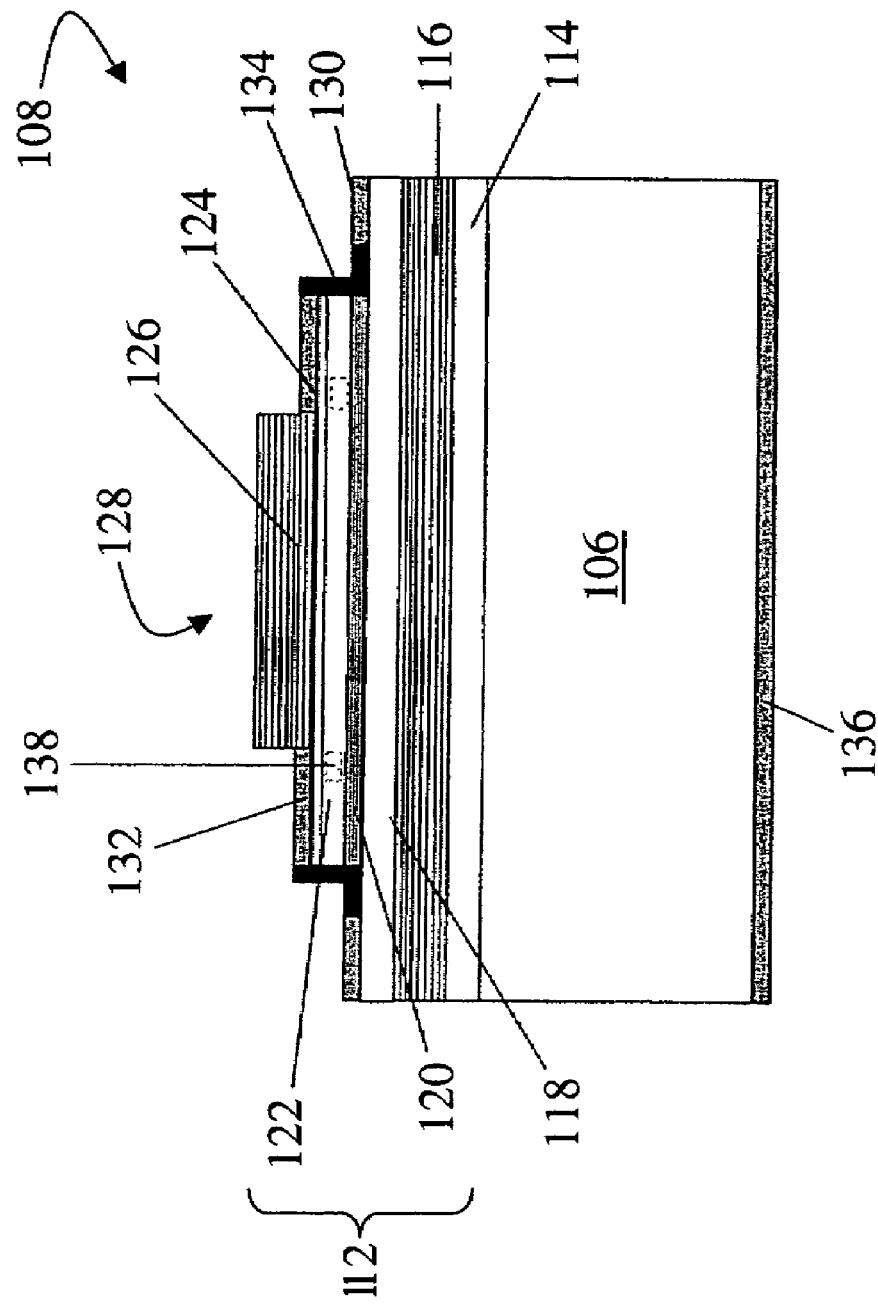
FIG. 4 illustrates the structure of another preferred excitation source, a homoepitaxial homoepitaxial resonant cavity LED.

In the exemplary resonant cavity light emitting device shown in FIG. 4, a stack of group III-nitride layers 112 grown on the gallium nitride substrate 106 includes in order of epitaxial deposition: an optional $n^+$ GaN layer 114; a first mirror sub-stack 116 defining an n-type AlInGaN distributed Bragg reflector (DBR); an n-type GaAlInN cladding layer 118; an active region 120 including a GaAlInN multiple quantum well structure; a p-type GaAlInN cladding layer 122; a current spreading layer 124; and a second mirror sub-stack 126 defining a p-type AlInGaN distributed Bragg reflector (DBR).

Selected portions of upper epitaxially deposited layers 120, 122, 124, 126 are lithographically removed, optionally along with removal of a portion of the thickness of the n-GaAlInN cladding layer 118, to define a device mesa 128 that includes a portion of the second mirror sub-stack 126 as shown in FIG. 4. The removal of material to define the device mesa 128 forms trenches in the stack of group III-nitride layers 112 that extend from an exposed surface of the stack 112 at least partway toward the single-crystal gallium nitride substrate 106. The trenches define laterally spaced islands of the active region 120. The device mesas 128 include the islands of the active region 120. Because the single-crystal gallium nitride substrate 106 is substantially free of tilt boundaries, portions of the single-crystal gallium nitride substrate 106 that extend between the device mesas 128 contain substantially no edge dislocation arrays such as those that typically form at low-angle tilt boundaries.

Electrical contact preferably is made by a frontside n-type electrode 130 contacting n-GaAlInN cladding layer 118, and by a frontside p-type electrode 132 contacting the current spreading layer 124. An insulating material 134, for example, $SiO_2$ or $SiN_x$, is preferably disposed between the electrodes 130, 132 to provide enhanced electrical isolation of the electrodes 130, 132 and to provide surface passivation. If the gallium nitride substrate 106 is doped n-type, the frontside n-type electrode 130 can be replaced by a backside n-type electrode 136 contacting the substrate 106. For surface emitting lasers the backside electrode 136 is preferably reflective, for example a Ti/Al metal stack. For a resonant cavity light emitting diode employing backside light emission, the backside electrode 136 is preferably substantially light transmissive, for example including substantially transparent indium tin oxide or a thin light-transmissive layer of metal. More preferably, for backside light emission the frontside n-electrode 130 is employed.

Further device fabrication processing may be performed depending upon the desired operation of the resonant cavity light-emitting device 108. For example, to laterally define the optical cavity in a vertical cavity surface emitting laser, ion implanted regions 138 are suitably formed by ion implantation. To define a circular aperture, for example, the ion implanted regions 138 form a circle defining the laser aperture. Similarly, to define a rectangular aperture, the ion implanted regions 138 form a rectangle defining the laser aperture.

The thicknesses and compositions of the various layers of the stack 112 of group III-nitride layers are selected based on the desired wavelength of operation and other operating characteristics. For example, the light emission wavelength of the active region 120 is determined by parameters such as thicknesses and compositions of the quantum wells and barriers. For 340 nm emission, a 2 nm $Al_{0.20}In_{0.04}Ga_{0.76}N/7$ nm $Al_{0.35}In_{0.07}Ga_{0.58}N$ quantum well is suitable. For 460 nm emission, a 3 nm $In_{0.15}Ga_{0.85}N/6$ nm $In_{0.05}Ga_{0.95}N$ quantum well is suitable. The precise compositions and layer thicknesses required to produce emission at a given wavelength may depend on the details of atomic-layer ordering of the AlInGaN material. It is also contemplated to employ a single GaAlInN quantum well active region. Those skilled in the art can select other quantum well structures for light emission in the ultraviolet to blue wavelength range (for example, in a range of about 250 nm to about 500 nm) using literature values for parameters that may impact the emission wavelength, such as for bandgaps of the group III-nitride layers, for electron and hole effective masses, for conduction and valence band offsets at interfaces, and so forth.

The active region 120 can be undoped, p-type, n-type, or a combination thereof. In a preferred embodiment, the quantum wells are undoped while the barrier layers are undoped or doped n-type. Because the lower bandgap quantum well materials such as InN, $In_xGa_{1-x}N$ and the like typically decompose at lower temperatures than does GaN, these layers are preferably deposited at temperatures between about 650° C. and 1050° C.

Obviously, modifications and alterations will occur to others upon reading and understanding the preceding, detailed description. For example, while the preceding description of homoepitaxial LEDs and resonant cavity devices is directed to vertical structures having top and bottom electrical contacts, an insulating or semi-insulating substrate could be used in conjunction with "side" contacts. Furthermore, GaN-based LEDs and resonant cavity devices are merely preferred excitation sources. For example, in an alternative embodiment the optical excitation source is a AlN-based LED or a gas discharge such as a Hg-based discharge of the type used in fluorescent lamps.

C. Sensors

As used herein, sensors include chemical, biochemical, and biological sensors such as antibody or nucleic acid probes. The sensors preferably are specific for the analyte. Being specific for the analyte means that the sensors prefer interacting with the analyte over substantially all other molecules present or potentially present in the sample. The fact that a sensor might preferentially bind to some conceivable molecule other than the analyte does not by itself mean that the sensor is not specific for the analyte. The sensor need only be specific enough for the analyte that the invention remains practical and reasonably reliable for its intended purpose.

The sensors preferably are securely attached to at least one surface within the inventive device that is exposed to the sample or analyte. Nucleic acid sensors are securedly attached when they remain attached from about 0° C. to at least about 100° C. The sensors preferably are attached via covalent or ionic bonds.

The sensors preferably are attached to a surface of the excitation source that is exposed to the sample. The sensors may be bound to a coating on the excitation source that facilitates their attachment, such as a sputter-deposited coating of gold, or they may be attached directly to the excitation source itself. In a variant of the invention, sensors are covalently or ionically bound to the interior or bottom of an indentation(s), i.e., a channel(s), trough(s), depression(s) or the like, through channel(s), trough(s) or the like, on or in the surface of the excitation source, and through which sample or analyte may flow and bind to the sensors bound therein. Alternatively, the sensors may be bound to an optical filter or a photodetector within the device.

In preferred embodiments, the sensors are single stranded DNA, RNA or synthetic peptide nucleic acids (PNA) that are bound via thiolated 5' ends to the surface of the excitation source that is exposed to the sample. To prevent or retard degradation of the bound probes by depolymerization reactions in the testing solution, 2'-oxymethyl, fluorine or an amino group is preferably added to the free ends of these probes.

D. Luminophores

The invention typically includes one or more types of luminophore that absorb light from the excitation source and that first emit light, or that emit light with a different characteristic, when the sensors interact with the analyte. Although the art has defined luminophore more narrowly as the part of a material that emits light, and a chromophore as the part of a material that absorbs light, the term luminophore is used more broadly herein to serve as shorthand for the material(s) that both absorb and emit light. As such, luminophores include chromophores, fluorophores, phosphors and chemilumophores. Herein, the term luminophore also includes any intercalator-type moiety or other agent necessary to alter the conformation of the luminophore, or otherwise affect its luminescence, when the sensors interact with the analyte.

The luminophores may be kept separate from the device until the assay takes place, whereupon the luminophores are placed into the sample solution and then bind either to the sensors or, preferably, to the complexes formed between the sensors and the analyte. Alternatively, the luminophores may initially be bound to the sensors or tethered to the same surface as the sensors, in which case the luminophores constitute an integral feature of the device embodiment per se.

In preferred embodiments, the luminophores emit little or no light unless and until the sensors interact with the analyte. If the luminophores instead emit light with a different characteristic when the sensors interact with the analyte, the difference is preferably a difference in wavelength or color. Furthermore, when more than one type of luminophore is used, the luminophores preferably have narrow emission bands—commonly used fluorescent tags have broad emission bands that overlap, making multiplexing difficult.

Preferably, the luminescence of the luminophores depends on a conformational change resulting from interaction of the sensors with the analyte. When the sensors and the analyte are nucleic acids, the luminophores are preferably intercalating and/or groove binding dyes such as SYBR Green I. Upon binding to duplexes (e.g., DNA/RNA hybrids) formed between the sensors and the analyte, SYBR Green I exhibits intense luminescence at 520 nm, which can readily be detected by eye, CCD camera, or photodetector. Examples of other luminophores that can indicate duplex formation include: intercalator dyes; ruthenium polypyridyl dyes; cyanine dyes; dyes based on phenanthridine, acridine, indole or imidazole structures; and other DNA/RNA stains such as silver stain.

Luminophores that indicate duplex formation can also be used with non-nucleic acid analytes or non-nucleic acid sensors, provided that nucleic acids are first attached to the non-nucleic acid analytes or non-nucleic acid sensors. For example, nucleic acids can be attached to aromatic hydrocarbons, carbohydrates, peptides, and proteins such as antibodies, scFv, diabodies, FAB and other antibody-like molecules.

E. Optical Filter and Photodetector

If the excitation source emits light at the same wavelength as the light emitted by the luminophores, the former will constitute a background signal that reduces sensitivity. This background signal may be mitigated or eliminated by inserting one or more optical filters between the excitation source and the sensors to absorb wavelengths that might otherwise contribute to a background signal.

In one embodiment of the invention, the light emitted by the luminophores when the sensors interact with the analyte is detected with the naked eye. In another embodiment, the light emitted by the luminophores is detected with a microscope or a photodetector. For example, detection of 10,000 different biomolecules simultaneously may be achieved by deposition of a 100×100 array of distinct sensors onto the surface of an LED, and may be detected either by scanning under a microscope or by coupling the light to a suitable photodetector comprising a 100×100 array of detector elements.

F. Analytes

The invention can be used to qualitatively or quantitatively detect or monitor numerous types of analyte molecules and the substances, organisms and processes of interest signified by the presence of such analyte molecules. The analytes preferably include biomolecules such as nucleic acids, proteins and carbohydrates. Detection of ribosomal RNA is particularly advantageous because of the much greater quantity in cells of ribosomal RNA relative to DNA. The invention can also be used to qualitatively or quantitatively detect or monitor anions, cations, organic molecules such as drugs and pesticides, inorganic molecules such as $O_2$, and so forth.

Preferably, the analyte solution is obtained by lysing cells and then denaturing the analyte DNA at 95 degrees C. The resulting ssDNA is preferably cut with restriction enzymes to form the target ssDNA. However, the invention is also applicable to DNA drawn directly from numerous types of samples including, for example, blood, urine, tissue, sputum, water, soil, foods, beverages, bodily fluids, ambient air, and so forth. Accordingly, the invention is applicable to diverse areas such as medical diagnostics, genomics, biohazard monitoring, and others.

In one embodiment, the invention is used for qualitative identification of an analyte, i.e., to determine whether the analyte is present or not. In another embodiment, the invention is used to quantify the concentration of analyte in the test solution. The binding constants of preferred sensors of the present invention, e.g., ssDNA, to the analyte, e.g., complementary ssDNA, are typically quite high. Analyte molecules in the environment of the sensors will therefore tend to bind irreversibly to the sensors at a rate that is characteristic of diffusion in the local medium until they are depleted from the medium. The concentration of analyte molecules may therefore be determined from the binding kinetics—analytes at a higher concentration will saturate the sensors more rapidly than analytes at a lower concentration.

In another embodiment, the analyte comprises a nucleic acid that differs at a single base position from non-analyte nucleic acids potentially present in the sample. Such an embodiment can be used to detect a single nucleotide polymorphism (SNP). In other embodiments, detecting the analyte qualitatively or quantitatively indicates one or more of the following: the presence of a single molecule of interest; the presence or concentration of a protein with a tertiary or quarternary structure of interest; denaturation of a nucleic acid duplex of interest; whether, or the extent to which, a dye of interest is binding to a molecule of interest; whether, or the extent to which, acid/base or redox reactions are occurring in a sample; the presence of, or a predisposition to, diseases such as cancer, tumors, leukemia, diabetes and neurodegenerative disorders; or the presence or concentration of hairpins, cruciforms or Z-DNA. Certain embodiments of the invention can be used for the following: continuous and real-time or near real-time detection of microbial contamination or growth; genotype characterization; detection of mutations; monitoring gene expression; or monitoring binding of a dye to a molecule of interest.

EXAMPLE I

An air-exposed GaN LED was sputter-coated with a thin layer of gold. Single stranded DNA oligonucleotides with thiolated 5' ends were attached to the gold-coated surface. The LED was placed in contact with a solution containing a population of complementary ssDNA, a luminescent intercalating dye, and a buffer. After hybridization to form a DNA duplex, the device emitted green light for 30 seconds that was visible to the naked eye. The amount of DNA on the substrate was determined to be 110 fmol, or 1.3 ng of ssDNA. In the absence of complementary ssDNA, the device emitted blue light. The device also emitted blue light in the presence of non-complementary ssDNA.

Figure 5:
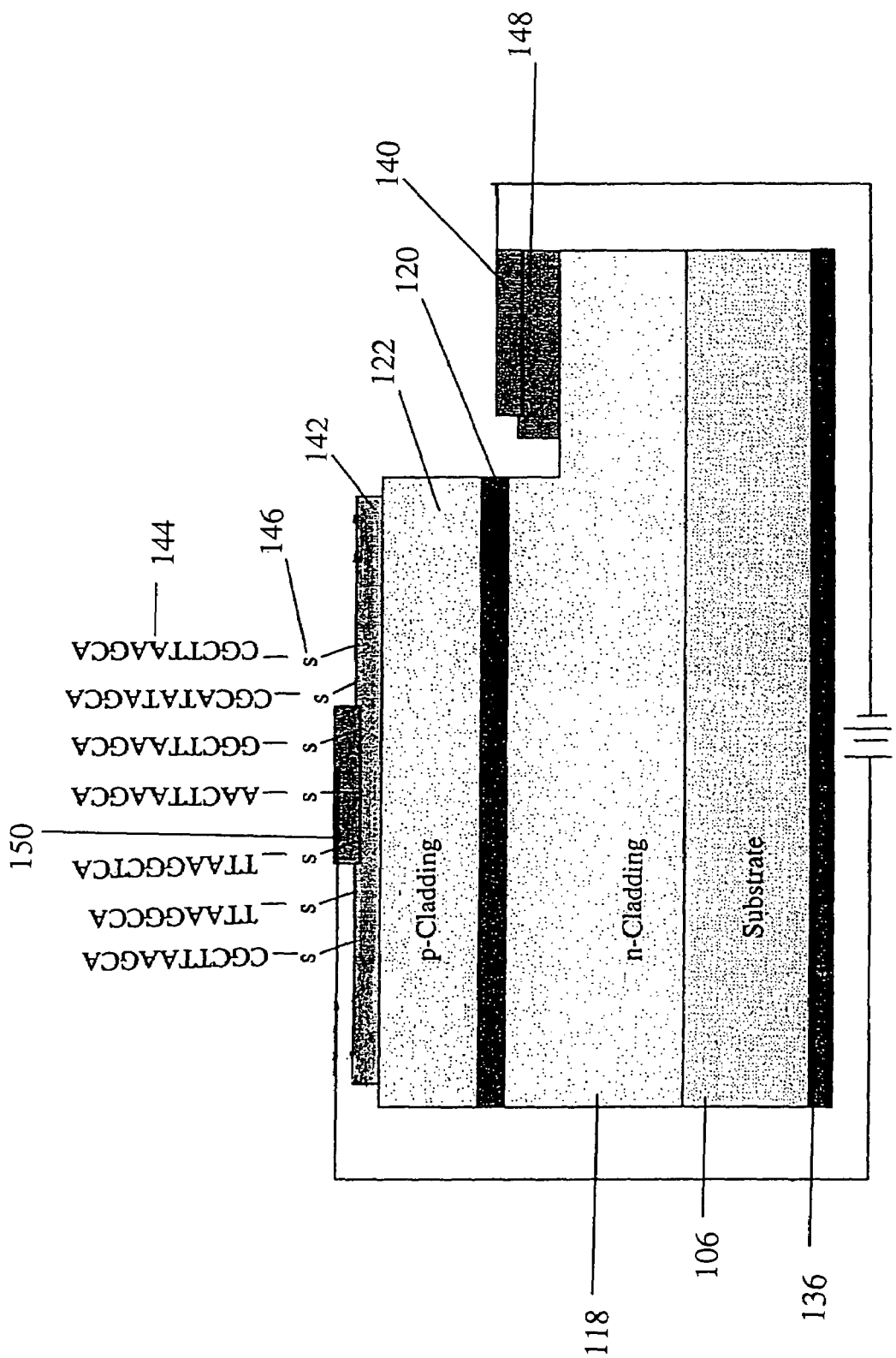
FIG. 5 shows a preferred embodiment of the inventive device, a GaN LED with 5' thiolated ssDNA molecules covalently bound to the LED surface, which has been sputter coated with gold.

FIG. 5 depicts a simplified view of an embodiment of the inventive device. The nucleic acid sensors 144 are bound via their thiolated 5' ends 146 to p-type electrode 142, which has a gold-coated surface. Disposed over part of p-type electrode 142 is bond pad 150. The sensor molecules 144 hybridize with the analyte, forming dsDNA. The luminescent dye (not shown) binds to the dsDNA, generating luminescence. When substrate 106 is conductive, the device employs a backside n-type electrode 136. When substrate 106 is insulated, the device employs an n-type side electrode 148 (with bond pad 140). In Example I, the device included an insulated substrate 106 and employed an n-type side electrode 148. Other features of the device are described here with reference to FIG. 4, where like numerals denote like features.

The invention has been described with reference to the preferred embodiments. Obviously, modifications and alterations will occur to others upon reading and understanding the preceding, detailed description. It is intended that the invention be construed as including all such modifications and alterations insofar as they come within the scope of the appended claims or the equivalents thereof.

The invention claimed is:

1. A device for detecting an analyte, comprising:
   (a) an excitation source that emits light capable of being absorbed and emitted by a luminophore, and
   (b) a sensor specific for the analyte that is attached directly or indirectly via a covalent or ionic bond to a surface of said excitation source, wherein said surface can be exposed to a sample.

2. The device of claim 1, wherein the surface of the excitation source includes a coating or matrix to facilitate attachment of the sensor and the sensor is covalently or ionically attached to the coating or matrix.

3. The device of claim 2, wherein the coating or matrix is a sputter-deposited coating of gold and the sensor is covalently attached thereto.

4. The device of claim 1, wherein the surface of the excitation source is bare and the sensor is attached directly to the substrate material of the excitation source itself.

5. The device of claim 1, wherein the surface of the excitation source is non-porous.

6. The device of claim 1, wherein the surface of the excitation source has a surface area below 0.01 m$^2$/g.

7. The device of claim 1, wherein the surface of the excitation source is smooth and planar.

8. The device of claim 1, wherein the sensor is attached to the bottom or interior of a channel(s) or trough(s) chat runs across the surface of the excitation source.

9. The device of claim 1, wherein the excitation source is nitride-based.

10. The device of claim 9, wherein the device has a flip-chip configuration in which the cladding layer(s) of the nitride-based excitation source are on a side of the nitride-based excitation source other than a side that is intended to be exposed to a sample.

11. The device of claim 10, wherein the nitride-based excitation source is GaN-based.

12. The device of claim 11, wherein the GaN-based excitation source is a GaN-based vertical cavity surface emitting laser diode.

13. The device of claim 11, wherein the CaN-based excitation source is a GaN-based resonant cavity LED.

14. The device of claim 11, wherein the CaN-based excitation source is a homoepitaxial GaN-based LED.

15. The device of claim 14, wherein the homoepitaxial GaN-based LED comprises a light emitting semiconductor active region disposed on a substrate comprised of GaN having a dislocation density less than about $10^5$ per cm$^2$.

16. The device of claim 15, wherein the homoepitaxial GaN-based LED comprises:
   a) a n-electrode,
   b) a n-GaN substrate,
   c) a n-GaN or n-Al$_w$Ga$_{(1-w)}$N cladding layer,
   d) an In$_x$Ga$_{(1-x)}$N active layer,
   e) a p-Al$_y$Ga$_{(1-y)}$N cladding layer,
   f) a p-GaN cladding layer, and
   g) a p-electrode,
   wherein $0 \leq x, y \leq 1$].

17. The device of claim 1, wherein an array of sensors is attached via covalent or ionic bonds to the surface of the excitation source.

18. The device of claim 17, wherein the sensors are isolated from each other on the surface of the excitation source by a grid comprised of an opaque material.

19. The device of claim 1, wherein the light emitted by the excitation source is monochromatic.

20. The device of claim 19, wherein the full width at half maximum of the emission spectrum of the excitation source is less than about ten percent of the peak wavelength.

21. The device of claim 1, further comprising an optical filter.

22. The device of claim 21, wherein the surface to which the sensor is bound is a surface on the optical filter.

23. The device of claim 1, further comprising a photodetector.

24. The device of claim 23, wherein the surface to which the sensor is bound is a surface on the photodetector.

25. The device of claim 1, wherein the sensor comprises a nucleic acid.

26. The device of claim 25, wherein the sensor comprises a single stranded nucleic acid that is bound to the surface via a thiol on the 5' end of the sensor.

27. The device of claim 1, further comprising a luminophore bound to the sensor prior to exposure to a sample.

28. The device of claim 1, further comprising a luminophore tethered to the same surface as the sensor.

29. The device of claim 1, wherein the device is capable of detecting the quantity of the analyte in a sample.

* * * * *

UNITED STATES PATENT AND TRADEMARK OFFICE
CERTIFICATE OF CORRECTION

| | | |
|---|---|---|
| PATENT NO. | : 7,102,158 B2 | Page 1 of 1 |
| APPLICATION NO. | : 10/746292 | |
| DATED | : September 5, 2006 | |
| INVENTOR(S) | : Steven Tysoe et al. | |

It is certified that error appears in the above-identified patent and that said Letters Patent is hereby corrected as shown below:

Col. 17, Line 2
Claim 8, line 2, change the word "chat" to -- that --.

Col. 17, Line 16
Claim 13, line 16, change "CaN" to -- GaN --.

Signed and Sealed this

Ninth Day of January, 2007

JON W. DUDAS
*Director of the United States Patent and Trademark Office*

SEQUENCE LISTING

```
<160> NUMBER OF SEQ ID NOS: 7

<210> SEQ ID NO 1
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 1
cgcttaagca                                                          10

<210> SEQ ID NO 2
<211> LENGTH: 9
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 2 ttaaggcca                                                            9

<210> SEQ ID NO 3
<211> LENGTH: 10
<212> TYPE: DNA
```

-continued

```
<213> ORGANISM: Unknown
<220> FEATURE:
<223> OTHER INFORMATION: single strand sensor for one or more analytes
      or produced by an organism of interest

<400> SEQUENCE: 3
ttaaggctca                                                              10

<210> SEQ ID NO 4
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 4
aacttaagca                                                              10

<210> SEQ ID NO 5
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 5
ggcttaagca                                                              10

<210> SEQ ID NO 6
<211> LENGTH: 11
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 6
cgcatatagc a                                                            11

<210> SEQ ID NO 7
<211> LENGTH: 10
<212> TYPE: DNA
<213> ORGANISM: Unknown
<220> FEATURE:
<223> OTHER INFORMATION: single strand sensor for one or more analytes
      or produced by an organism of interest

<400> SEQUENCE: 7
cgcttaagca                                                              10
```